(12) United States Patent
Lee et al.

(10) Patent No.: US 6,482,751 B2
(45) Date of Patent: Nov. 19, 2002

(54) TITANIUM DIOXIDE LAYER SERVING AS A MASK AND ITS REMOVED METHOD

(75) Inventors: Ming-Kwei Lee, Kaohsiung (TW); Hsin-Chih Liao, Kaohsiung (TW)

(73) Assignee: Winbond Electronics Corp. (TW)

( * ) Notice: Subject to any disclaimer, the term of this patent is extended or adjusted under 35 U.S.C. 154(b) by 0 days.

(21) Appl. No.: 09/842,465

(22) Filed: Apr. 26, 2001

(65) Prior Publication Data

US 2001/0016426 A1 Aug. 23, 2001

Related U.S. Application Data

(60) Division of application No. 09/366,682, filed on Aug. 4, 1999, which is a continuation-in-part of application No. 09/306,080, filed on May 6, 1999, now Pat. No. 6,238,965.

(51) Int. Cl.$^7$ .............................................. H01L 21/302
(52) U.S. Cl. ....................... 438/745; 438/747; 438/752; 438/753; 438/754
(58) Field of Search ................................ 438/745, 747, 438/752, 753, 754, 763, 785

(56) References Cited

U.S. PATENT DOCUMENTS

| 4,524,126 A | * | 6/1985 | Marinace et al. ............ 430/311 |
| 5,609,694 A | | 3/1997 | Asai ............................ 136/255 |
| 6,008,135 A | * | 12/1999 | Oh et al. ..................... 438/720 |
| 6,066,359 A | * | 5/2000 | Yao et al. ................. 427/126.3 |

* cited by examiner

*Primary Examiner*—Robert Kunemund
*Assistant Examiner*—Binh X. Tran
(74) *Attorney, Agent, or Firm*—Madson & Metcalf

(57) ABSTRACT

A titanium dioxide layer serving as a mask used in a manufacturing process of integrated circuit and its removed method are disclosed. The method includes the steps of forming a titanium dioxide layer on the integrated circuit device to serve as a mask, and using an etchant to selectively remove the titanium dioxide layer. The titanium dioxide layer is formed by the steps of providing a titanium-containing material, adding an acid substance to the titanium-containing material to form a mixture, and exposing the integrated circuit device to the mixture to form the titanium dioxide layer thereon.

17 Claims, 8 Drawing Sheets

TITANIUM DIOXIDE LAYER SERVING AS A MASK AND ITS REMOVED METHOD

FIELD OF THE INVENTION

The present invention is a division of application Ser. No. 09/366,682, filed Aug. 4, 1999, which is a continuation-in-part application of the parent application bearing Ser. No. 09/306,080 and filed on May 6, 1999 now U.S. Pat. No. 6,238,965. The present invention is related to a titanium dioxide layer serving as a mask and its removed method, and more particularly to a titanium dioxide layer serving as a mask used in a manufacturing process of an integrated circuit and its removed method.

BACKGROUND OF THE INVENTION

Generally, in the manufacturing process for an integrated circuit, most of semiconductor devices are formed through a serial processes, such as deposition, photolithography, or etching process, in order to smoothly accomplish the device fabrication.

In the manufacturing process of integrated circuit, oxides (e.g. silicon dioxide) or nitrides (such as silicon nitride) are often used as mask materials. For. example, silicon nitride mainly includes two functions: (1) during the manufacturing process of metal oxide semiconductor (MOS) device, it is necessary to form a silicon nitride layer by low pressure chemical vapor deposition (LPCVD) to serve as an anti-oxidative mask when conducting the growth of an oxide layer; in addition, a silicon dioxide layer is further formed between the silicon substrate and the silicon nitride layer to serve as a pad oxide to prevent the silicon nitride layer from being directly formed on the silicon surface which may results in an overhigh stress; and (2) during the trench etching process, the silicon nitride layer is used as an anticorrosive passivation layer, generally utilizing the combination of the silicon nitride layer and the silicon dioxide layer, and formed by plasma-enhanced chemical vapor deposition (PECVD); because it functions as a passivation layer, the anticorrosive property is very important; on the contrary, in order to perform a peeling process (i.e. the finally etching process), the used material must be selectively etched, that is, using a suitable etching solution to perform the peeling process.

From the above description, it is found that the combination of the silicon nitride layer and the silicon dioxide layer can be applied to many aspects. However, for the commonly used mask materials such as silicon nitride and silicon dioxide, their formed way, i.e. CVD, not only spends a lot of equipment costs but also causes some additional problems due to high-temperature growth. In addition, if the silicon nitride layer is directly formed on the silicon substrate, it will result in a high stress on the silicon surface. Because the adhensive ability of the silicon nitride layer to the silicon substrate is relatively poor, a silicon dioxide layer must be formed between the silicon nitride layer and the silicon substrate during the deposition process so as to successfully form a silicon nitride layer on the silicon surface. However, this step also increases the complication of the manufacturing process. If a single-layer material can be substituted for the combination of the silicon nitride layer and the silicon dioxide layer, it will greatly enhance the efficiency of the growth process.

More importantly, in the current chemically etching process for removing the silicon nitride layer, hot phosphoric acid is used to peel off it. Its etch rate is about 60 Å/min. However, there still exists the necessity of improvement to meet the requirement of the current industry of integrated circuit.

SUMMARY OF THE INVENTION

An object of the present invention is to provide a method for forming a titanium dioxide layer on a device.

Another object of the present invention is to provide a titanium dioxide layer serving as a mask used in a manufacturing process of an integrated circuit and its removed method.

The method includes the steps of forming a titanium dioxide layer on the integrated circuit device to serve as the mask, and using an etchant to selectively remove the titanium dioxide layer.

Perferably, the integrated circuit device is a silicon wafer.

The titanium dioxide layer is formed by the steps of providing a titanium-containing material, adding an acid substance to the titanium-containing material to form a mixture, and exposing the integrated circuit device to the mixture to form the titanium dioxide layer thereon. The titanium-containing material is preferably $H_2TiF_6$ and has a concentration ranging from 2.0M to 6.1M.

Preferably, the acid substance is one selected from a group consisting of nitric acid, boric acid, hydrogen chloride, and a mixture thereof. The concentration of nitric acid preferably ranges from 0.1M to 0.5M. The concentration of boric acid preferably ranges from 0.1M to 0.9M. The concentration of hydrogen chloride can range from 0.001M to 2M.

In accordance with the present invention, the titanium dioxide layer is formed by a liquid phase deposition at a temperature ranging from 20° C. to 80° C. Besides, the cleaned integrated circuit device is exposed to the mixture for 2 to 30 minutes.

The etchant can be phosphoric acid. The temperature change of phosphoric acid is used to control the etch rate of the titanium dioxide layer. The temperature of phosphoric acid can be greater than 100° C., preferably from 100° C. to 180° C., and the concentration of phosphoric acid ranges from 1% to 85%.

The present invention may best be understood through the following description with reference to the accompanying drawings, in which:

DETAILED DESCRIPTION OF THE PREFERRED EMBODIMENT

Figure 1:
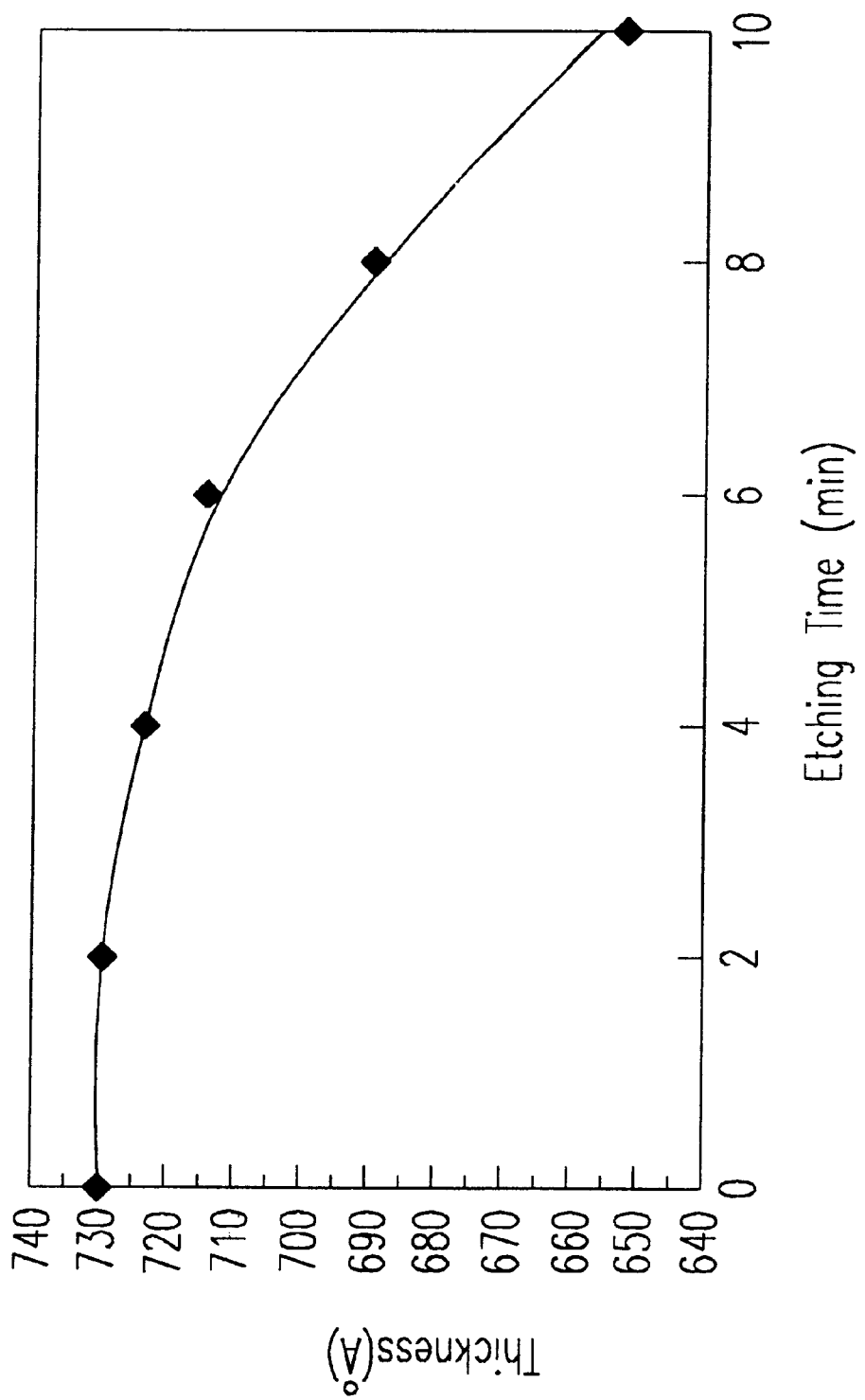
FIG. 1 is a graph showing the relationship between the thinkness change of the titanium dioxide layer etched by 25° C. hydrofluoric acid and the etching time in the present invention.

The present invention will now be described more detailedly with reference to the following embodiments. It is to be noted that the following descriptions of the preferred embodiments of this invention are presented herein for the purpose of illustration and description only. It is not intended to be exhaustive or to be limited to the precise form disclosed.

The present invention provides a method for forming a titanium dioxide layer to function as a mask used in the manufacturing process of integrated circuit. The titanium dioxide layer is formed by mixing a titanium-containing material and an acid substance and exposing the precleaned integrated circuit device to the mixture to form the titanium dioxide layer thereon. The titanium-containing material is preferably $H_2TiF_6$ and has a concentration ranging from 2.0M to 6.1M. The acid substance can be nitric acid, boric acid, hydrogen chloride, or a mixture thereof.

Particularly, the present invention utilizes a low-cost, low-temperature, and simple liquid phase deposition (LPD) to grow a titanium dioxide film as a mask. Certainly, in order to check this practicability, its anticorrisive ability will be tested. In addition, a suitable etching solution is also provided to increase its etch rate for improving the defects of the prior arts, for example, expensive cost, high growth temperature, complicated process, and low etch rate.

The present invention is characterized by that nitric acid is added to the raw material $H_2TiF_6$ for increasing the growth rate of titanium dioxide layer and enhancing its stability. Because nitrous acid is often contained in nitric acid solution, both of them will spontaneously react with each other to provide a great number of electron holes so that elemental titanium can be reduced from the raw material $H_2TiF_6$ and accepts the electron hole provided by nitric acid to form titanium ion and then to become titanium dioxide.

In order to further understand the present invention, the principle is detailedly described as follows.

Typically, the reaction equations of forming titanium dioxide by liquid phase deposition are as follows:

$$H_2TiF_6 + 2H_2O \leftrightarrow TiO_2 + 6HF \quad (1)$$

$$H_3BO_3 + 4HF \leftrightarrow BF + H_3O^+ + 2H_2O \quad (2)$$

By the above-described reactions, its growth rate is less than 6 Å/min, which is not suitable to be applied in the production line. Therefore, the present invention develops an improved method, that is, adding nitric acid to the raw material $H_2TiF_6$ for facilitating its growth rate. Its principle is described in detail as follows.

After analyzing the reaction equations (1) and (2), it is found that titanium is dissociated from the solution of $H_2TiF_6$, accepts the electron hole to form a titanium ion, and is then reacted with hydroxide ion in water to generate titanium hydroxide. Finally, the dehydration is performed to generate titanium dioxide and hydrogen. The reaction equations are as follows:

$$Ti + 2h^+ \rightarrow Ti^{2+} \quad (3)$$

$$Ti^{2+} + 2OH^- \rightarrow Ti(OH)_2 \quad (4)$$

$$Ti(OH)_2 \rightarrow TiO_2 + 2H_2 \quad (5)$$

Taking a semiconductor silicon substrate as an example, there is a charge exchange between silicon and the electrolyte due to the chemical potential difference between silicon and the electrolyte, resulting in that the surface of silicon substrate lacks electron (i.e. silicon provides electron holes on the surface of silicon substrate) to generate a situation of Eq. (3). Hydroxide ion of Eq. (4) is dissociated from water. If water is provided sufficiently (i.e. the amount of hydroxide ion is sufficient), Eq. (4) can be performed quickly. Therefore, the bottleneck of overall reaction is the supplement of electron hole, that is, Eq. (3). If the electron hole can be supplied fully in the entire reaction, the reaction rate can be increased.

Because nitrous acid is often contained in nitric acid solution, both of them will spontaneously react with each other to provide a great number of electron hole as described in following reaction equations:

$$HNO_3 + HNO_2 \rightarrow N_2O_4 + 2H_2O \quad (6)$$

$$N_2O_4 \leftrightarrow 2NO_2 \quad (7)$$

$$2NO_2 \leftrightarrow 2NO_2^- + 2h^+ \quad (8)$$

$$2NO_2^- + 2H^+ \leftrightarrow 2HNO_2 \quad (9)$$

From Eq. (8), it is found that the electron hole can be generated in the solution after adding nitric acid therein. Because the number of electron hole is proportional to the concentration of nitric acid, Eq. (3) can be performed quickly, that is, the growth rate of the titanium dioxide layer can be greatly increased.

In a preferred embodiment of the present invention, 20 ml 6.1M hydrofluotitanic acid is used as a growth solution and then an appropriate amount of nitric acid is added therein to catalyze the reaction. Finally, the precleaned silicon wafer is exposed to the mixed solution and the growth of titanium dioxide is performed at 40° C. After a few minutes, the samples to be tested are accomplished. Subsequently, these samples are used to test the anti-corrosive property of the formed titanium dioxide layer to ensure that the formed titanium dioxide layer can be used as a mask.

The tested samples are respectively exposed in three selected etching solutions to test their anticorrosive ability. Three selected etching solutions are 49% hydrofluoric acid, 25° C. 85% phosphoric acid, and P-etching solution (HF (49%): $HNO_3$ (70%): $H_2O$=3:2:60). The analyzed results are detailedly described as follows.

(1) Etching Resistance for 49% hydrofluoric acid (HF) at 25° C.

Figure 2:
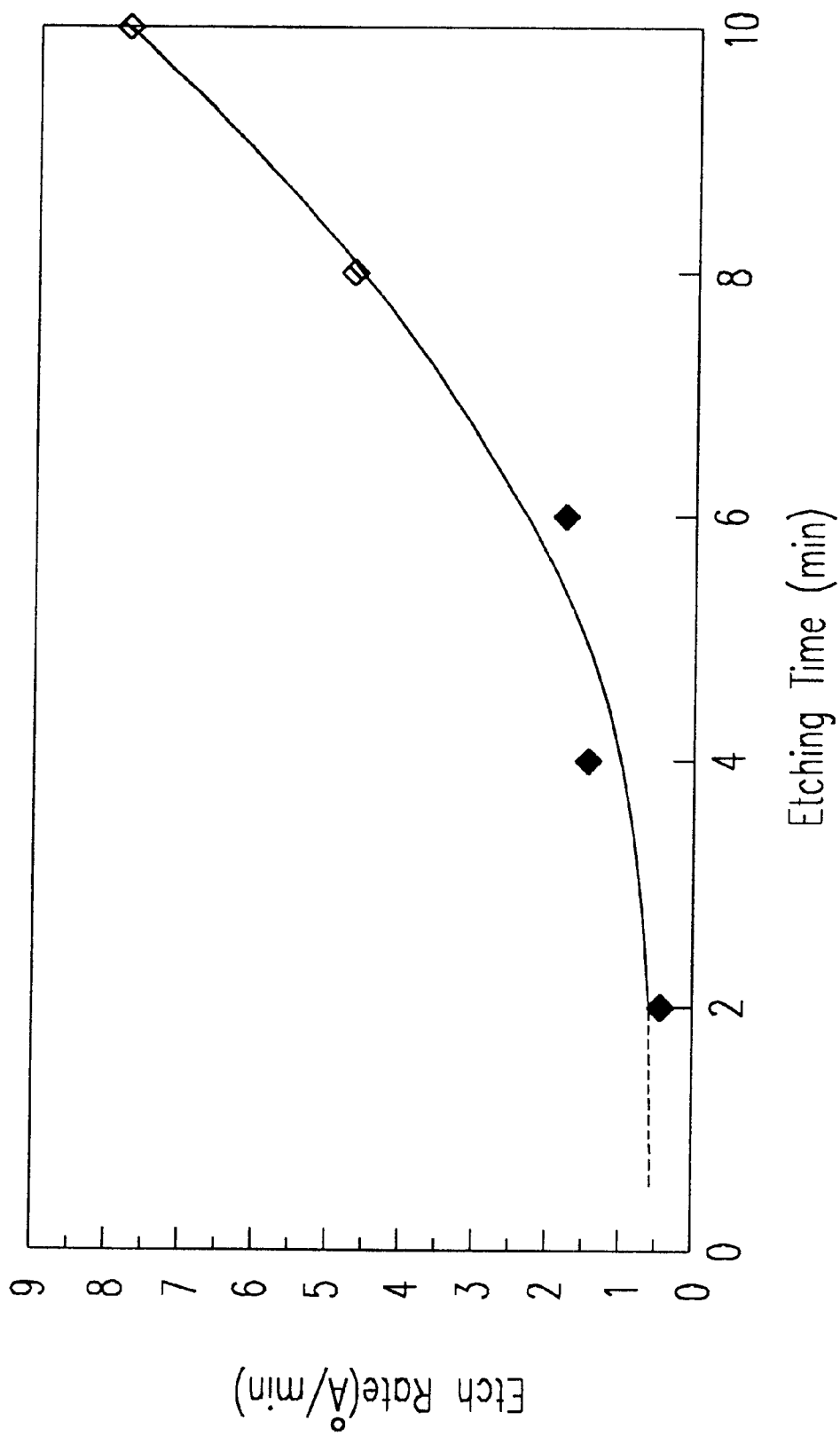
FIG. 2 is a graph showing the relationship between the etch rate of the titanium dioxide layer etched by 25° C. hydrofluoric acid and the etching time in the present invention.

FIG. 1 and FIG. 2 respectively illustrate the etching ability and etch rate of hydrofluoric acid to the titanium dioxide layer. For example, if the formed titanium dioxide layer on the silicon wafer is exposed in the 49% hydrofluoric acid solution for 10 minutes, it is observed from these two figures that the thickness of the titanium dioxide layer is reduced from 731 Å to 652 Å and the etch rate is changed from 0.5 Å/min to 7.9 Å/min. Therefore, the titanium dioxide layer formed by liquid phase deposition has a good anticorrosive ability against 49% hydrofluoric acid.

(2) Etching Resistance for 85% phosphoric acid at 25° C.

Figure 3:
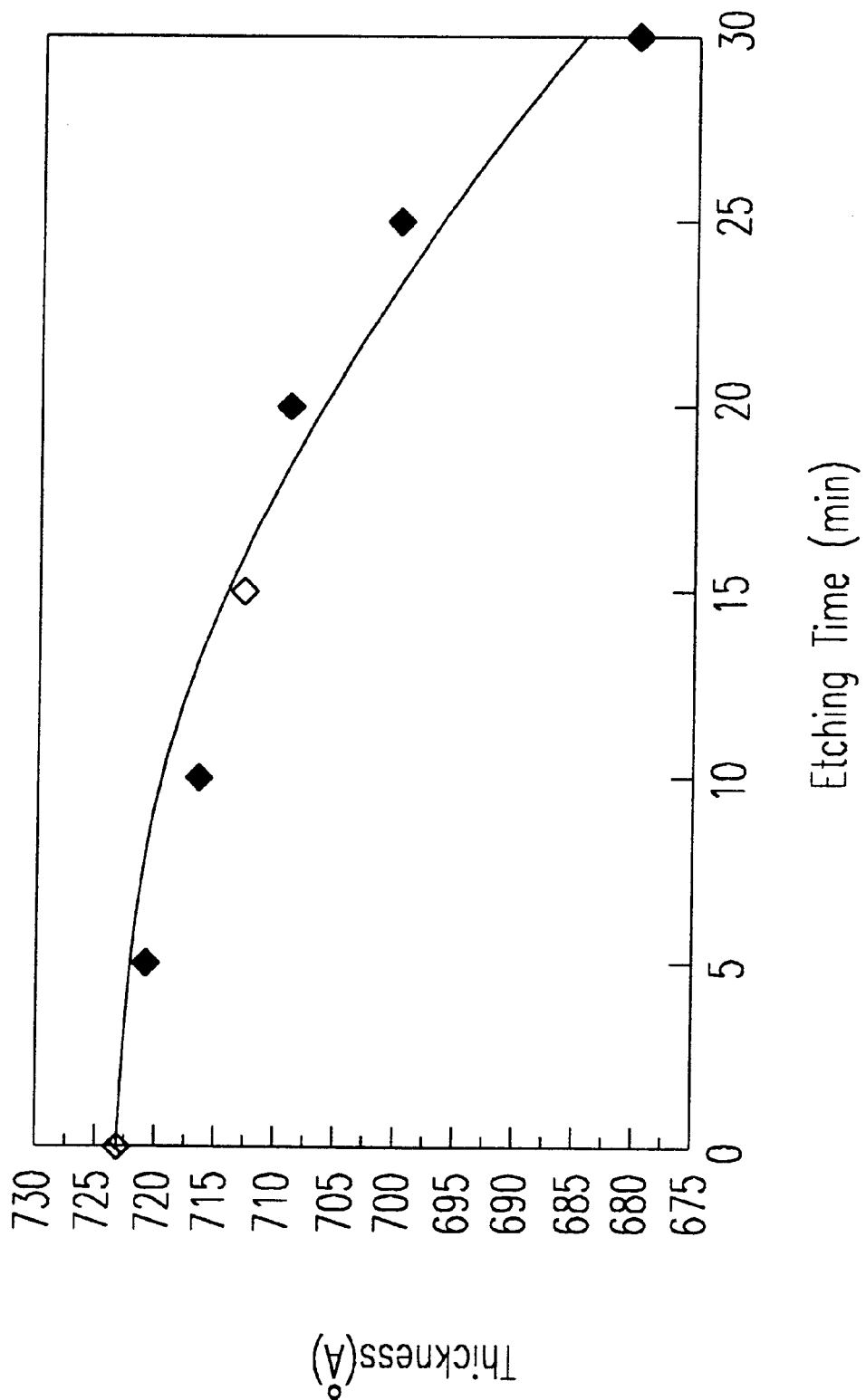
FIG. 3 is a graph showing the relationship between the thinkness change of the titanium dioxide layer etched by 25° C. phosphoric acid and the etching time in the present invention.
Figure 4:
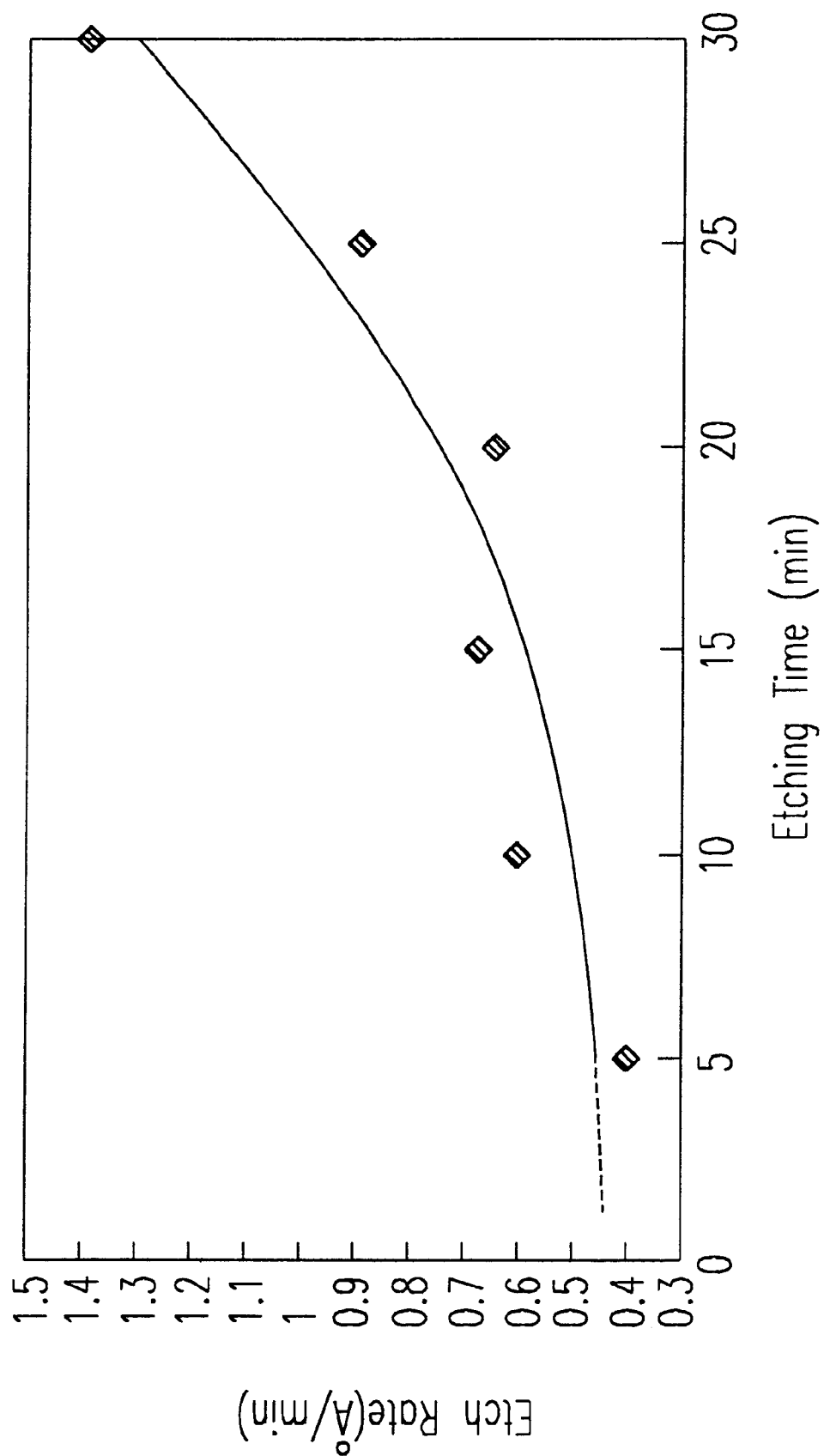
FIG. 4 is a graph showing the relationship between the etch rate of the titanium dioxide layer etched by 25° C. phosphoric acid and the etching time in the present invention.

FIG. 3 and FIG. 4 respectively illustrate the etching ability and etch rate of 25° C., 85% phosphoric acid to the titanium dioxide layer. For example, if the formed titanium dioxide layer on the silicon wafer is exposed in 25° C., 85% phosphoric acid for 30 minutes, it can be seen from these two figures that the thickness of the titanium dioxide layer is reduced from 723 Å to 682 Å and the etch rate is changed from 0.8 Å/min to 1.37 Å/min. Thus, the titanium dioxide layer formed by liquid phase deposition has an excellent anticorrosive ability against 25° C., 85% phosphoric acid.

(3) Etching Resistance for P-etching solution at 25° C.

Figure 5:
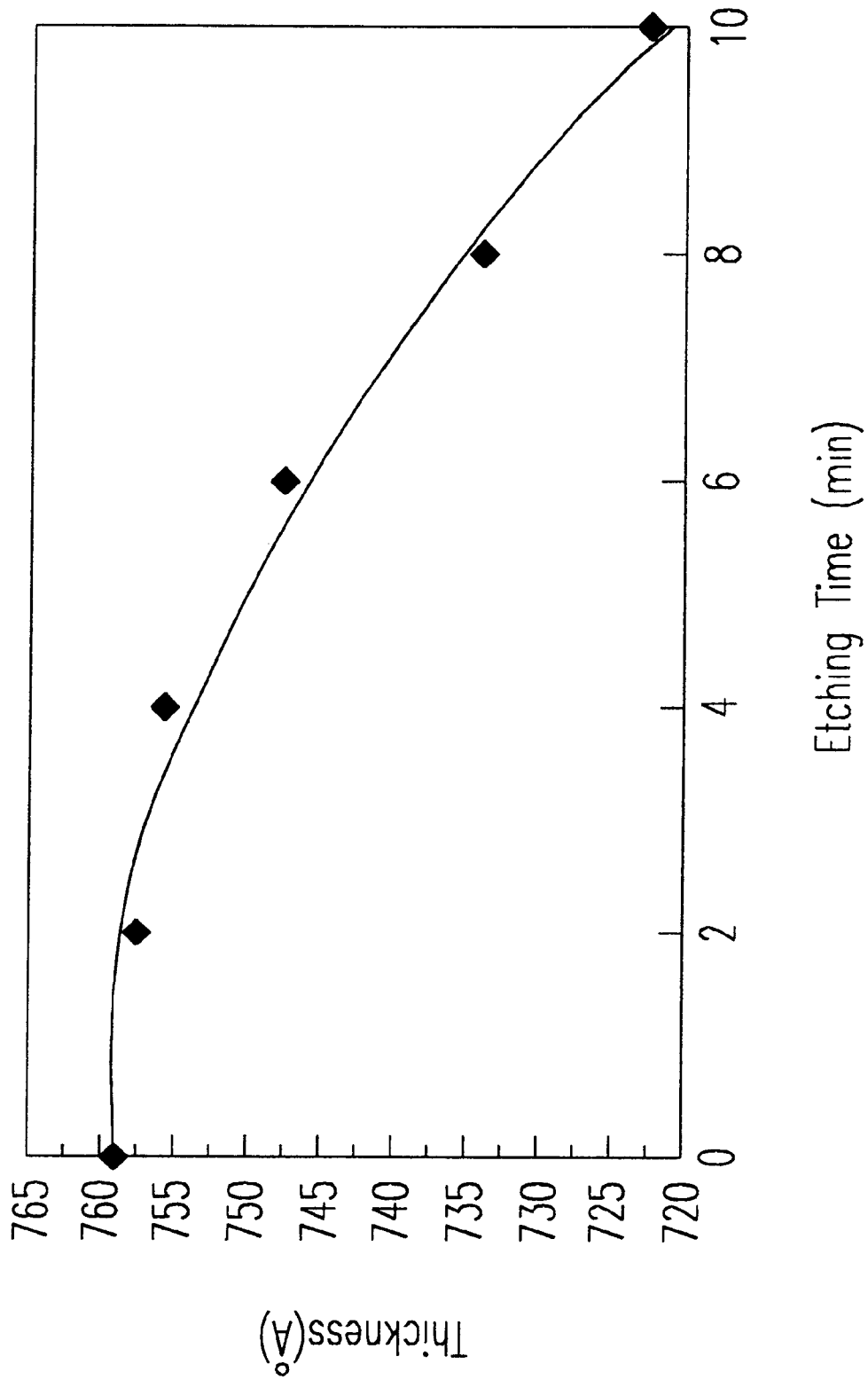
FIG. 5 is a graph showing the relationship between the thinkness change of the titanium dioxide layer etched by 25° C. P-etching solution and the etching time in the present invention.
Figure 6:
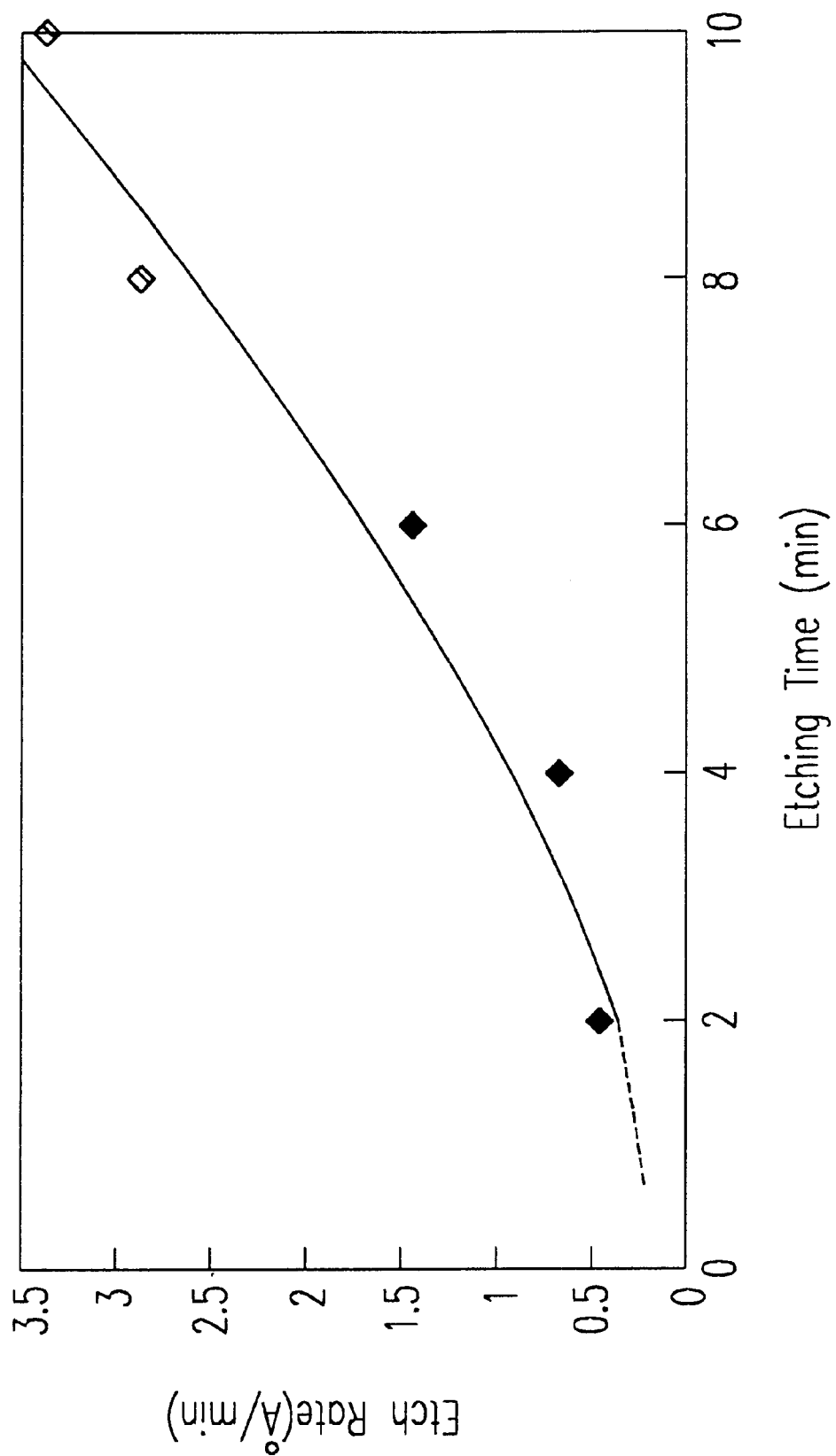
FIG. 6 is a graph showing the relationship between the etch rate of the titanium dioxide layer etched by 25° C. P-etching solution and the etching time in the present invention.

The P-etching solution is prepared from a mixture of 49% HF 49%, 70% $HNO_3$, and $H_2O$ in a ratio of 3:2:60. FIG. 5 and FIG. 6 respectively illustrate the etching ability and etch rate of the P-etching solution to the titanium dioxide layer. For example, if the formed titanium dioxide layer on the silicon wafer is exposed in the P-etching solution for 10 minutes, it is found from these two figures that the thickness of the titanium dioxide layer is reduced from 759 Å to 723 Å and the etch rate is changed from 0.5 Å/min to 3.4 Å/min. Hence, the titanium dioxide layer formed by liquid phase deposition has an excellent anticorrosive ability against the P-etching solution.

On the other hand, the present invention also provides a method for selectively removing the titanium dioxide layer. A preferred embodiment of the present invention adopts 180° C., 85% phosphoric acid as an etchant. The formed titanium dioxide layer with a thickness of 689 Å on the silicon wafer is exposed in 180° C., 85% phosphoric acid for 1.5 minutes.

Figure 7:
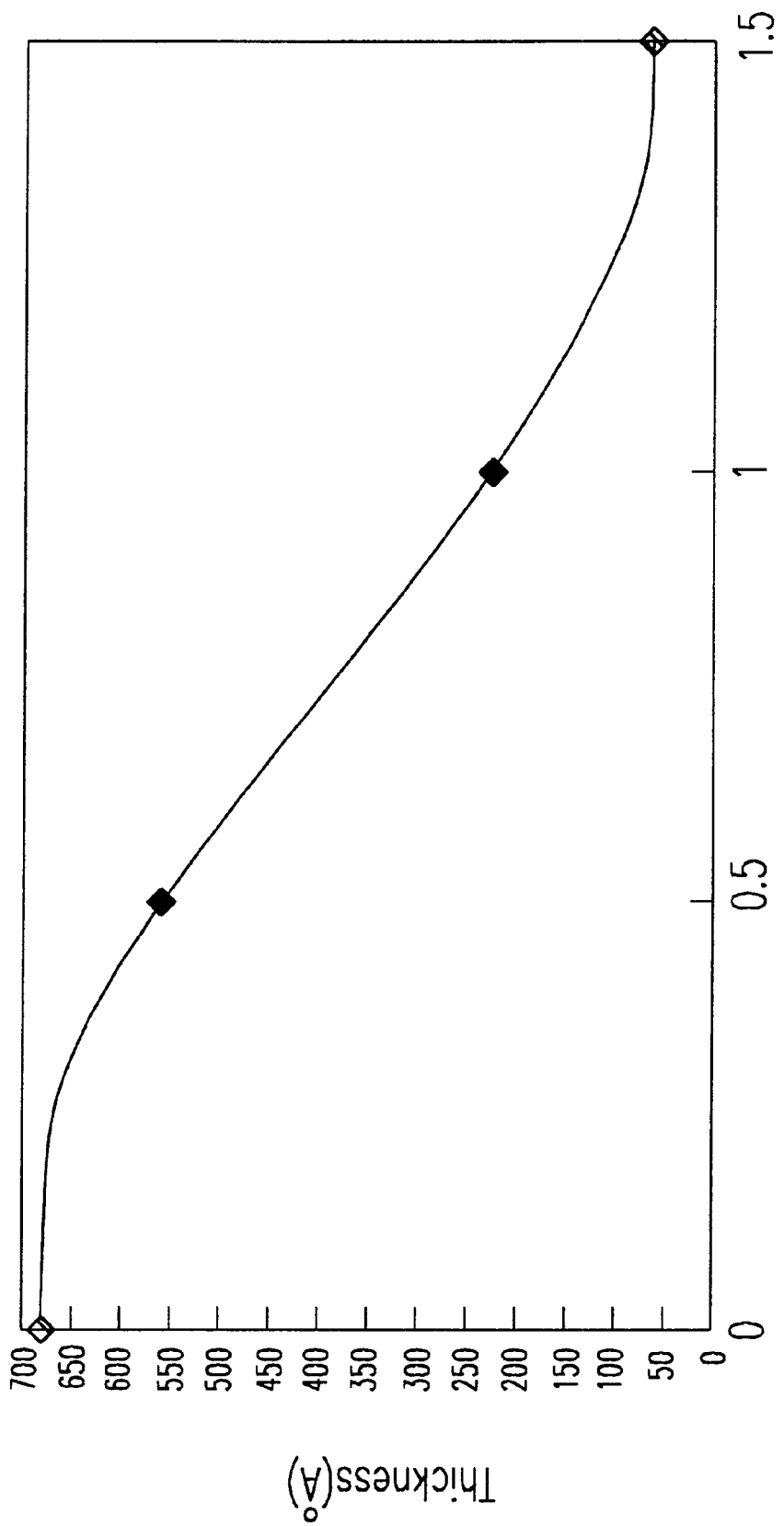
FIG. 7 is a graph showing the relationship between the thinkness change of the titanium dioxide layer etched by 180° C., 85% phosphoric acid and the etching time in the present invention.
Figure 8:
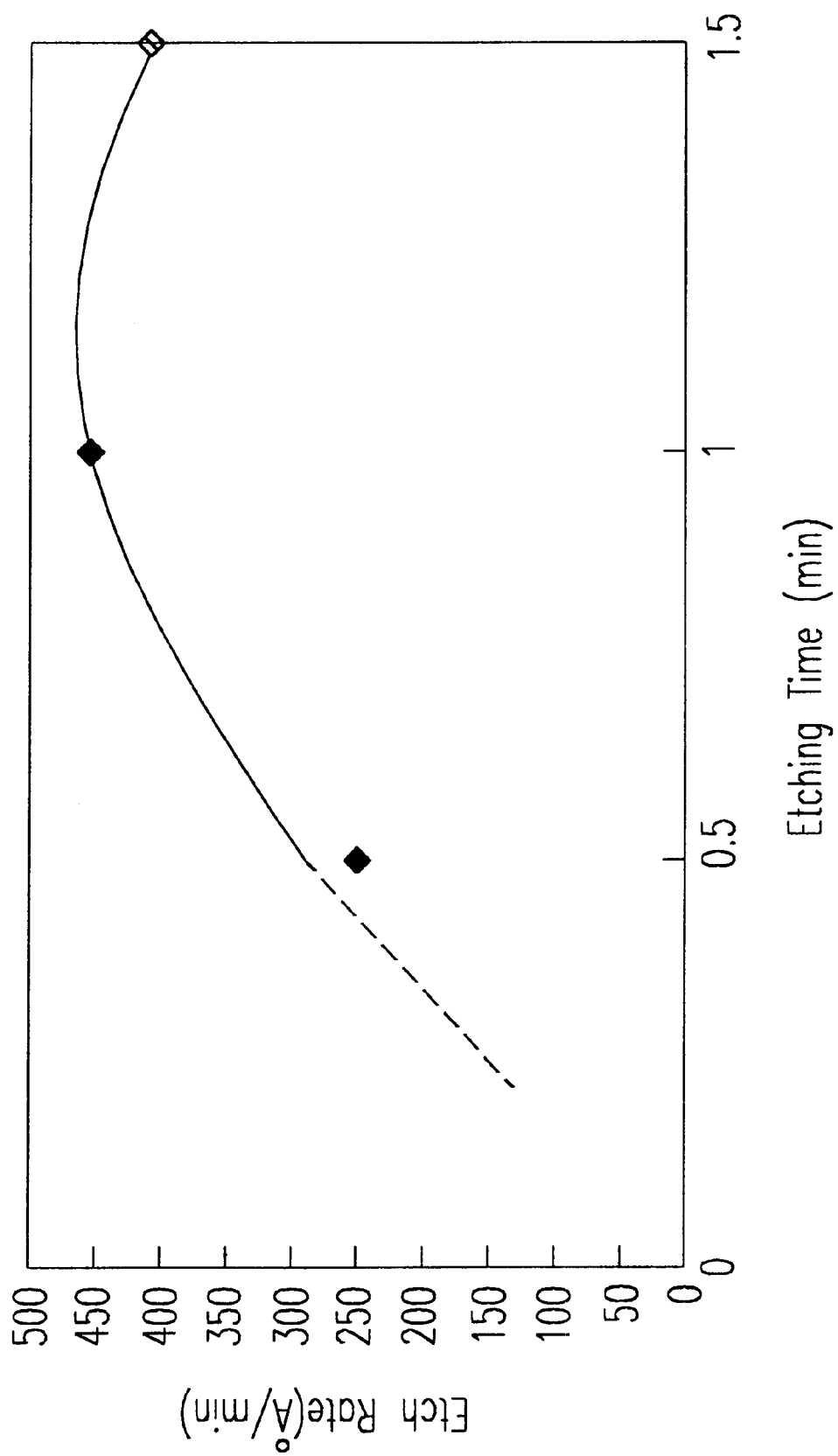
FIG. 8 is a graph showing the relationship between the etch rate of the titanium dioxide layer etched by 180° C., 85% phosphoric acid and the etching time in the present invention.

FIG. 7 and FIG. 8 respectively illustrate the etching ability and etch rate of 180° C., 85% phosphoric acid to the titanium dioxide layer. From these two figures, it is found that the thickness of the titanium dioxide layer is greatly reduced from 689 Å to 69 Å and the etch rate can be up to 457 Å/min. Hence, the etch rate of the titanium dioxide layer is quite greater than that of the silicon nitride (about 60 Å/min). Thus, this way can significantly reduce the production time and enhance the efficiency of the etching process. Moreover, the temperature change of phosphoric acid can be utilized to control the etch rate of the titanium dioxide layer. This not only can precisely control the use time but enlarge the range of application.

To sum up, the present invention utilizes a low-temperature, low-cost, and simple liquid phase deposition to form a titanium dioxide layer to serve as a mask. Besides, hydrofluoric acid, 25° C. 85% phosphoric acid, and P-etching solution are used to test the anticorrosive ability of the titanium dioxide layer. Consequently, the titanium dioxide layer has an excellent anticorrosive ability against these three commonly used etching solution. The titanium dioxide layer is advantageously used as a mask. Moreover, during the process of selectively removing the titanium dioxide layer, its etch rate can be controlled by the temperature change of phosphoric acid to increase the accuracy of the production process.

In the manufacturing process of integrated circuit, the present invention provides a titanium dioxide layer to replace the conventional combination of the silicon nitride layer and the silicon dioxide layer to serve as a mask. When the titanium dioxide layer is directly deposited on the silicon wafer, high stress on the silicon surface will not be generated. According to the present invention, the method for forming the titanium dioxide layer is relatively simple and does not need any complicated equipment so that the manufacturing cost can be greatly lowered.

Certainly, all conditions, including the concentration and volume of hydrofluotitanic acid, boric acid, hydrogen chloride, or nitric acid, the growth temperature, and the growth time, used in the above-described examples should not be limited because these parameters can adjusted according to the desired requirement to obtain the best effect.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for removing a mask used in a manufacturing process of an integrated circuit device, comprising:
   providing a titanium-containing material;
   adding an acid substance to said titanium-containing material to form a mixture, wherein said acid substance is one selected from the group consisting of nitric acid, hydrogen chloride, a mixture of nitric acid and boric acid, a mixture of nitric acid and hydrogen chloride, and a mixture of boric acid and hydrogen chloride;
   exposing said integrated circuit device to said mixture to form a titanium dioxide layer on said integrated circuit device to serve as said mask; and
   using an etchant to selectively remove said titanium dioxide layer.

2. The method according to claim 1 wherein said integrated circuit device is a silicon wafer.

3. The method according to claim 1 wherein said titanium-containing material is $H_2TiF_6$.

4. The method according to claim 1 wherein a concentration of said titanium-containing material ranges from 2.0M to 6.1M.

5. The method according to claim 1 wherein a concentration of said nitric acid ranges from 0.1M to 0.5M.

6. The method according to claim 1 wherein a concentration of said boric acid ranges from 0.1M to 0.9M.

7. The method according to claim 1 wherein a concentration of said hydrogen chloride ranges from 0.001M to 2M.

8. The method according to claim 1 wherein said titanium dioxide layer is formed by a liquid phase deposition.

9. The method according to claim 1 wherein said titanium dioxide layer is formed at a temperature ranging from 20° C. to 80° C.

10. The method according to claim 1 wherein said integrated circuit device is exposed to said mixture for 2 to 30 minutes.

11. The method according to claim 1 wherein said etchant is phosphoric acid.

12. The method according to claim 11 wherein a temperature change of phosphoric acid is used to control an etch rate of said titanium dioxide layer.

13. The method according to claim 12 wherein a concentration of phosphoric acid ranges from 1% to 85%.

14. The method according to claim 12 wherein the temperature of phosphoric acid is greater than 100° C.

15. The method according to claim 14 wherein said temperature of phosphoric acid ranges from 100° C. to 180° C.

16. A method for removing a mask used in a manufacturing process of an integrated circuit device, comprising:
   providing a titanium-containing material;
   adding an acid substance to said titanium-containing material to form a mixture, wherein said acid substance is an acid or acid mixture containing one or more acids selected from the group nitric acid and hydrogen chloride;

exposing said integrated circuit device to said mixture to form a titanium dioxide layer on said integrated circuit device to serve as said mask; and using an etchant to selectively remove said titanium dioxide layer.

17. A method for removing a mask used in a manufacturing process of an integrated circuit device, comprising:

providing a titanium-containing material;

adding an acid substance to said titanium-containing material to form a mixture, wherein said acid substance is an acid or acid mixture containing one or more acids selected from the group nitric acid and hydrogen chloride or mixtures thereof;

exposing said integrated circuit device to said mixture to form a titanium dioxide layer on said integrated circuit device to serve as said mask; and using an etchant to selectively remove said titanium dioxide layer.

* * * * *